United States Patent [19]

Kim et al.

[11] Patent Number: 5,767,019

[45] Date of Patent: Jun. 16, 1998

[54] METHOD FOR FORMING A FINE CONTACT HOLE IN A SEMICONDUCTOR DEVICE

[75] Inventors: Sang Wook Kim; Hae Jung Lee, both of Kyoungkido, Rep. of Korea

[73] Assignee: Hyundai Electronics Industries Co., Ltd., Kyoungkido, Rep. of Korea

[21] Appl. No.: 697,834

[22] Filed: Aug. 28, 1996

[30] Foreign Application Priority Data

Aug. 28, 1995 [KR] Rep. of Korea ............... 1995-26990

[51] Int. Cl.⁶ ........................................ H01L 21/336
[52] U.S. Cl. ...................... 438/696; 438/701; 438/713; 438/723
[58] Field of Search ................... 156/643.1, 646.1, 156/662.1, 656.1, 657.1, 661.11, 644.1; 437/228, 195; 438/694, 696, 701, 713, 738, 723

[56] References Cited

U.S. PATENT DOCUMENTS 5,068,202 11/1991 Crotti et al. .................. 437/67
5,219,792 6/1993 Kim et al. .................... 437/195
5,477,975 12/1995 Rice et al. .................... 156/345
5,556,501 9/1996 Collins et al. ................. 156/345

FOREIGN PATENT DOCUMENTS 8-032053 2/1996 Japan.

*Primary Examiner*—R. Bruce Breneman
*Assistant Examiner*—George Goudreau
*Attorney, Agent, or Firm*—Jacobson, Price, Holman & Stern, PLLC

[57] ABSTRACT

Disclosed is a method for forming a fine contact hole, and more particularly, a method capable of minimizing the loss of a silicon substrate. In the method for forming the contact hole according to the present invention, since the spacer is formed on the sidewall in the contact hole at the time of performing the dry etching process which makes it wide the approach to the contact hole, the contact area is hardly damaged by the etchant. Then, the dry etching process in accordance with the present invention can minimizes the loss of the substrate because the substrate to be exposed is under the protection of the insulating layer 43. The substrate can be less damaged than 100

11 Claims, 6 Drawing Sheets

5,767,019

METHOD FOR FORMING A FINE CONTACT HOLE IN A SEMICONDUCTOR DEVICE

BACKGROUND OF THE INVENTION

1. Field of the Invention

The present invention relates to a method for forming a fine contact hole, and more particularly, to a method capable of minimizing the loss of a silicon substrate.

2. Description of the prior Art

Generally, when an electrical interconnection is formed between a first conducting layer and a second conducting layer which is insulated from contact with the first conducting layer, a contact hole must be formed, removing a portion of a insulating layer insulating the first conducting layer from contact with the second conducting layer.

With an increase of the integration of the semiconductor device, the step-coverage is poor because the height of the contact hole becomes higher and width thereof becomes narrower.

Accordingly, in order to obtain a favorable step-coverage, the approach to the contact hole must be widely formed. Then, the contact hole forms itself into a wine glass.

FIGS. 1A to 1C are cross-sectional views illustrating a method for forming a contact hole according to the first embodiment of a prior art.

As shown in FIG. 1A, an insulating layer 2 is formed on a conducting layer 1, such as a silicon substrate, and a photoresist pattern 3 is formed on the insulating layer 2 to define a contact area. The wet etching process is then subject to the upper portion of the insulating layer 2 to form the wide approach to the contact hole, using the photoresist pattern 3 as an etching mask.

After the wet etching process, as shown in FIG. 1B, the dry etching process is applied to the remaining insulating layer 2 until the conducting layer 1 is exposed, using the same etching mask, the photoresist pattern 3. Finally, the etching profile is obtained as shown in FIG. 1C.

However, in this conventional method, the wet etching process can not exactly control the ratio of "a" to "b" because of its own characteristics. Furthermore, it is impossible to obtain a smaller contact hole than the area defined by the photoresist pattern 3.

FIGS. 2A and 2B are cross-sectional views illustrating a method for forming a contact hole according to the second embodiment of a prior art.

As shown in FIG. 2A, an insulating layer 22 is formed on a conducting layer 21, such as a silicon substrate, and a photoresist pattern (not shown) is formed on the insulating layer 22 to define the contact area. The dry etching process is then subject to the insulating layer 22, exposing the surface of the conducting layer 21.

After the dry etching process, as shown in FIG. 2B, the blanket etching process is applied to the patterned insulating layer 22 to make the approach to the contact hole wide.

In the second embodiment, a good profile can be obtained by simple processes. However, it is impossible to obtain a smaller contact hole than the area defined by the given contact mask (photoresist pattern). Also, the shortcoming of this method is that it is difficult to control the loss of the exposed layer at the blanket etching process. Since the insulating layer typically consists of a stacked layers which are formed by using a plurality of insulating layers, heterogeneous stacked insulating layers are exposed on the sidewall of the contact hole. Accordingly, in the case where the isotropic etching is subject to the staked layer before the deposition process for a metal layer, prominence and depression are generated on the sidewall of the contact hole because each insulating layer has an etching rate different from one another.

FIG. 3 is a cross-sectional view illustrating a method for forming a contact hole according to the third embodiment of a prior art. This method is called the Side Oxide Space Contact (hereinafter, referred to as a SOSCON ) method.

As shown in FIG. 3, this method forms a spacer on the sidewall of the contact hole. That is, a first insulating layer 32 is formed on a conducting layer 31, such as a silicon substrate, and a photoresist pattern (not shown) is formed on the first insulating layer 32 to define the contact area. The dry etching process is then subject to the insulating layer 32, exposing the surface of the conducting layer 31. Next, a second insulating layer 33 for the spacer is deposited and a blanket etching is applied to the second insulating layer 33.

This SOSCON method has an advantage in that the spacer can contribute to the formation of the fine contact hole. However, this method has a problem in that the step-coverage is poor because the approach to the contact hole can not become broader.

particularly, in the case where the SOSCON method is used together with the dry slop etching process in forming the contact hole (for example, in the case where the process, as shown in FIG.3, is executed after performing the process, as shown in FIG.2), the loss of the substrate is generated by the plasma at the dry slop etching process. That is, the SOSCON method, which has been performed to form the spacer, causes the substrate in the contact area to be exposed to the etchant in the following dry slop etching process. As a result, the substrate in the contact area is attacked is with the etchant throughout the dry slop etching process so that the exposed substrate is considerably attacked.

SUMMARY OF THE INVENTION

Therefore, it is an object of the present invention to provide a method for forming a fine contact hole which can minimize the loss of a silicon substrate by performing a spacer through the dry slop etching process.

In accordance with an aspect of the present invention, there is provided a method, comprising the steps of: forming a first insulating layer on a substrate; removing the portion of the first insulating layer, exposing the substrate; forming a second insulating layer for a spacer on the resulting structure; and applying a dry etching process to the first and second insulating layers in order that the approach to the contact hole is made wide and the spacer is made on the sidewall of the contact hole.

BRIEF DESCRIPTION OF THE DRAWINGS

Other objects and aspects of the invention will become apparent from the following description of the embodiments with reference to the accompanying drawings, in which.

DETAIL DESCRIPTION OF THE PREFERRED EMBODIMENT

Hereinafter, an embodiment of the present invention will be described below in detail referring to FIGS. 4A to 4C wherein is shown a method capable of minimizing the loss of the substrate in the formation of the contact hole according to an embodiment of the present invention.

Figure 1A:
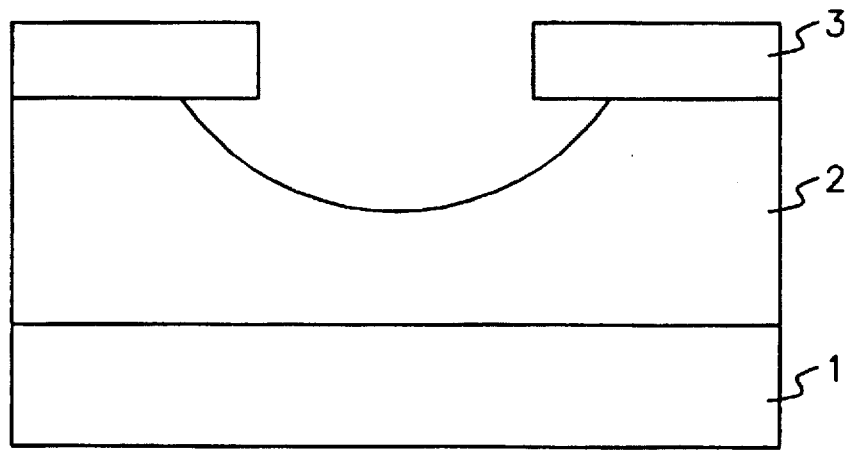
FIGS. 1A to 1C are cross-sectional views illustrating a method for forming a contact hole according to the first embodiment of a prior art.
Figure 1B:
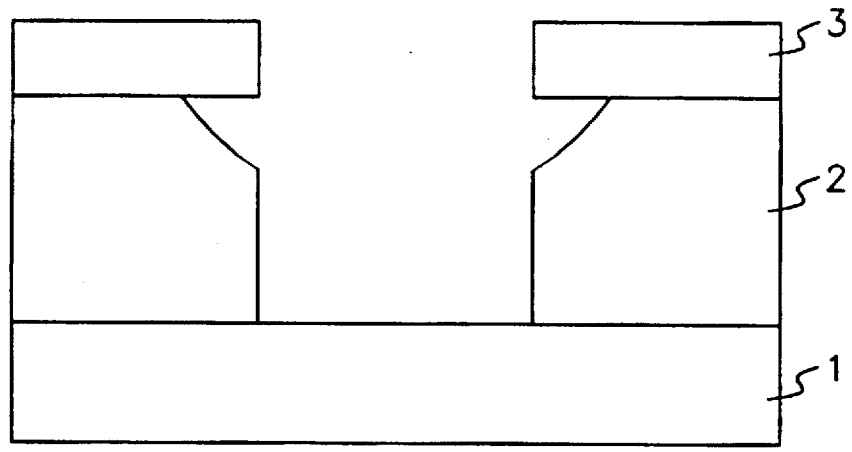
Figure 1C:
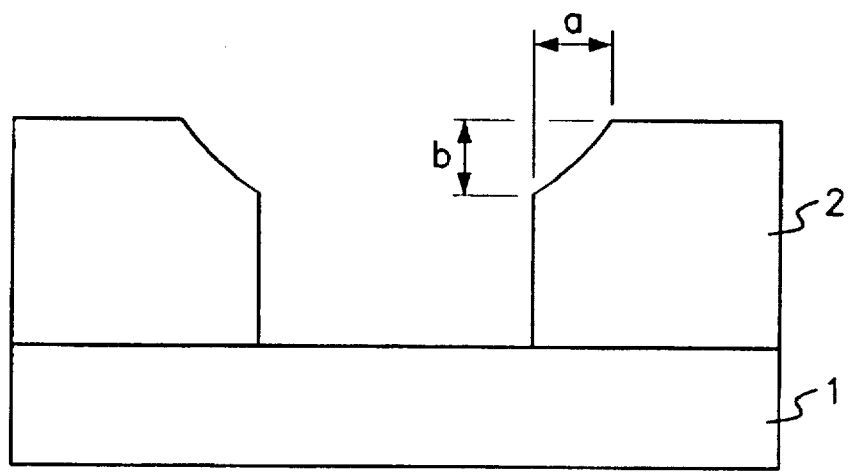
Figure 2A:
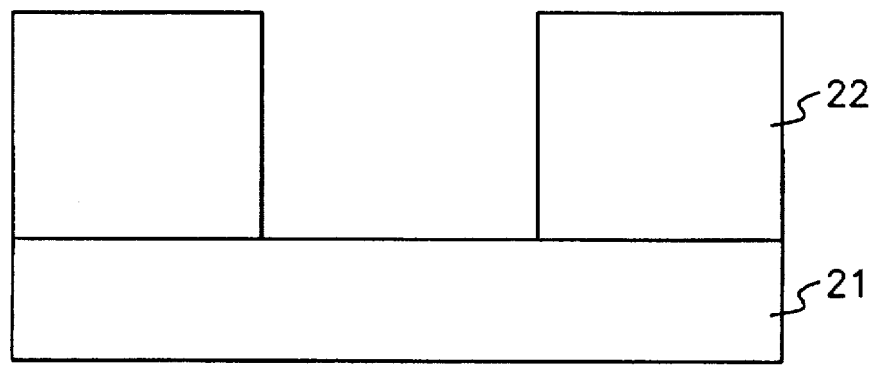
FIGS. 2A and 2B are cross-sectional views illustrating a method for forming a contact hole according to the second embodiment of a prior art.
Figure 2B:
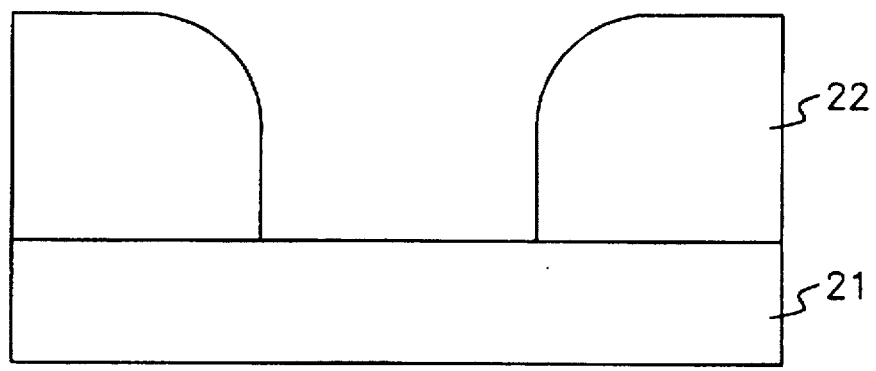
Figure 3:
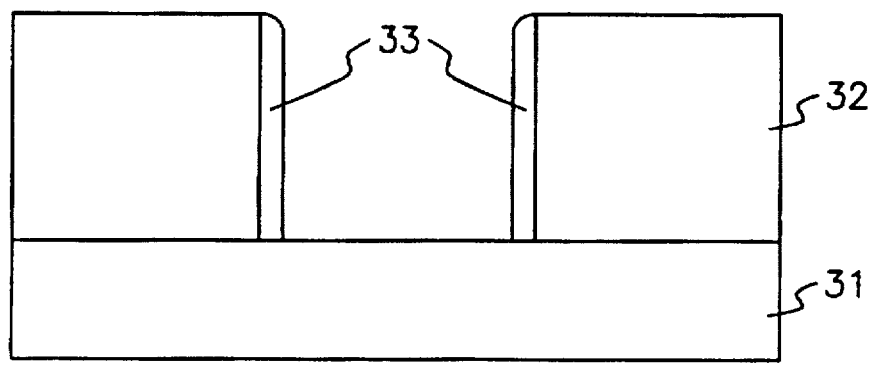
FIG. 3 is a cross-sectional view illustrating a method for forming a contact hole according to the third embodiment of a prior art.
Figure 4A:
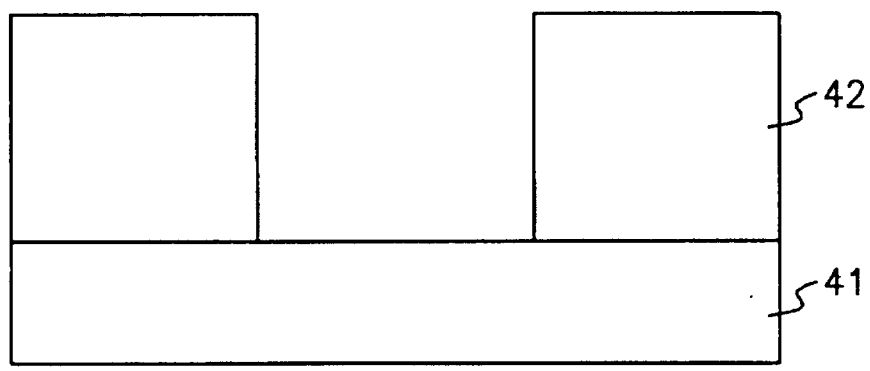
FIGS. 4A to 4C are cross-sectional views illustrating a method capable of minimizing the loss of the substrate in the formation of the contact hole according to an embodiment of the present invention.

First, FIG. 4A shows the step for defining a contact area using a photoresist pattern (not shown). In detail, the photoresist pattern to define the contact area is formed on an insulating layer 42 which is formed on a substrate 41. The insulating layer 42 consists of a silicon oxide layer, a silicon nitride layer, a silicon oxygen nitride layer, or their stacked layers. The insulating layer 42 is removed by the lithographic process using the photoresist pattern as an etching mask, thereby exposing the portion of the substrate to be contacted to a metal layer.

Figure 4B:
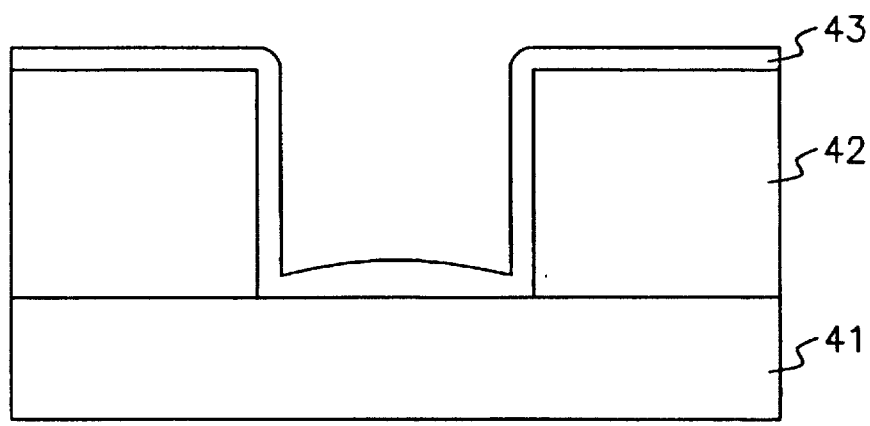

Next, referring to FIG. 4B, an insulating layer 43 for a spacer is formed on the resulting structure. This spacer makes it possible to diminish the contact size having been formed by the photoresist pattern.

Figure 4C:
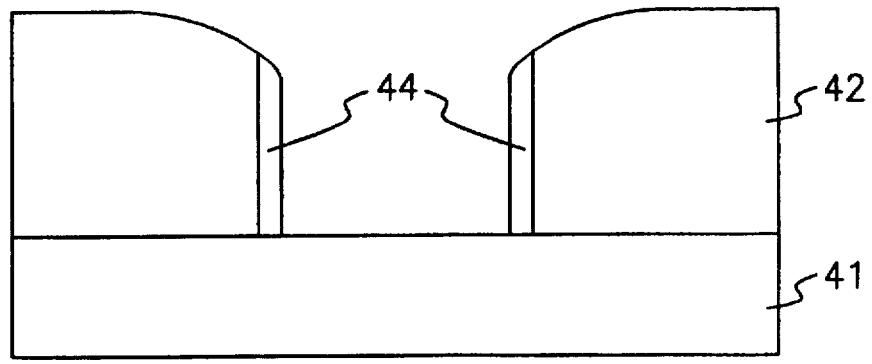

In sequence, as shown in FIG. 4C, the dry etching process is applied to the insulating layers 42 and 43 without an etching mask. At this time, the dry etching process should be carried out by properly controlling the processing conditions. It should be noted that the dry etching process simultaneously forms the spacer and the wide approach to the contact hole at one processing step.

In a preferred embodiment, the device is loaded into the plasma vacuum chamber having a heating silicon roof to use the ICP (Inductively Coupled plasma) method. At this time, processing conditions are as follows:

Processing gas: $CF_4$, $CHF_3$, $CH_3F$, $C_2F_6$, $C_3F_8C_2H_2F_4$ or their compound gas Flow of the processing gas: 15–50 sccm Source RF power: 1800–2800 Watt Bias RF power: 700–1600 Watt Heating temperature of the silicon roof: 220°–280° C.

Etching Additive gas: Ar, He, CO, $O_2$ or their compound gas

In the method for forming the contact hole according to the present invention, since the spacer is formed on the sidewall in the contact hole at the time of performing the dry etching process which makes it wide the approach to the contact hole, the contact area illustrated in FIG. 4A is hardly damaged by the etchant. Accordingly, the dry etching process in accordance with the present invention can minimizes the loss of the substrate because the substrate to be exposed is under the protection of the insulating layer 43. The substrate can be damaged less than 100 Å.

As apparent from the stated above, the present invention has effects in that a good step-coverage can be obtained, minimizing the loss of the substrate. Also, the present invention provides a method for forming a fine pattern of 0.2 m or less by using the spacer. Furthermore, the present invention can be used in forming the via hole connecting a first conducting layer to a second conducting layer.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a contact hole, comprising the steps of:

forming a first insulating layer on a conducting layer;

removing a portion of the first insulating layer, exposing the conducting layer, thereby forming a resulting structure;

forming a second insulating layer on the resulting structure; and applying a dry slope etching process to the first and second insulating layers, wherein an approach surface of the first insulating layer to the contact hole is sloped, thereby etching the second insulating layer and simultaneously forming a spacer on a sidewall of the contact hole.

2. The method in accordance with claim 1, wherein the dry etching process is performed by an inductively coupled plasma method.

3. The method in accordance with claim 1, wherein the dry etching process comprises using at least one member selected from the group containing of $CF_4$, $CHF_3$, $CH_3F$, $C_2F_6$, $C_3F_8$ and $C_2H_2F_4$ as an etching gas.

4. The method in accordance with claim 3, wherein the etching gas further comprises an additive gas which is at least one member selected from the group consisting of Ar, He, Co and $O_2$.

5. The method in accordance with claim 3, wherein the flow of the etching gas is in a range of 15–50 sccm.

6. The method in accordance with claim 1, wherein the step of applying the dry slope etching process to the first and second insulating layers is executed in a processing chamber having an inductively coupled RF source in a power range of 1800–2800 Watt.

7. The method in accordance with claim 6, wherein the processing chamber has a capacitively coupled RF bias in a power range of 700–1600 Watt.

8. The method in accordance with claim 2, wherein the step of applying the dry etching process to the first and second insulating layers is executed in a processing chamber having a heating silicon roof.

9. The method in accordance with claim 8, wherein the temperature of the silicon roof is in a range of 220°–280° C.

10. The method in accordance with claim 1, wherein the conducting layer is a silicon substrate.

11. The method in accordance with claim 1, wherein the first insulating layer is a stacked layer which is formed by using a plurality of insulating layers.

* * * * *